(12) United States Patent
Kokubun et al.

(10) Patent No.: US 9,077,381 B2
(45) Date of Patent: Jul. 7, 2015

(54) MEMORY CONTROLLER, STORAGE DEVICE AND MEMORY CONTROL METHOD

(71) Applicant: KABUSHIKI KAISHA TOSHIBA, Minato-ku (JP)

(72) Inventors: Naoaki Kokubun, Kanagawa (JP); Osamu Torii, Tokyo (JP); Toshikatsu Hida, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 62 days.

(21) Appl. No.: 13/950,753

(22) Filed: Jul. 25, 2013

(65) Prior Publication Data

US 2014/0245099 A1    Aug. 28, 2014

Related U.S. Application Data

(60) Provisional application No. 61/770,092, filed on Feb. 27, 2013.

(51) Int. Cl.
*H03M 13/00* (2006.01)
*H03M 13/15* (2006.01)
*H03M 13/35* (2006.01)

(52) U.S. Cl.
CPC ........ *H03M 13/151* (2013.01); *H03M 13/1515* (2013.01); *H03M 13/152* (2013.01); *H03M 13/1525* (2013.01); *H03M 13/1545* (2013.01); *H03M 13/35* (2013.01)

(58) Field of Classification Search
CPC .......... H03M 13/151; H03M 13/1515; H03M 13/35; H03M 13/152; H03M 13/1525; H03M 13/1545; H03M 13/159; H03M 13/6516; H04L 1/004; H04L 1/0041
See application file for complete search history.

(56) References Cited

U.S. PATENT DOCUMENTS

| | | | |
|---|---|---|---|
| 8,484,541 B1 * | 7/2013 | Anholt | 714/781 |
| 2002/0046382 A1 * | 4/2002 | Yang | 714/758 |
| 2008/0281896 A1 * | 11/2008 | Sameda et al. | 708/490 |
| 2010/0293432 A1 | 11/2010 | Miyata et al. | |
| 2013/0061115 A1 * | 3/2013 | Imai et al. | 714/763 |
| 2014/0053046 A1 * | 2/2014 | Anholt | 714/782 |

FOREIGN PATENT DOCUMENTS

| | | |
|---|---|---|
| JP | 2001-352252 | 12/2001 |
| JP | 2005-73187 | 3/2005 |
| JP | 2010-268114 | 11/2010 |

* cited by examiner

*Primary Examiner* — Guerrier Merant
(74) *Attorney, Agent, or Firm* — Oblon, McClelland, Maier & Neustadt, L.L.P.

(57) ABSTRACT

According to one embodiment, a memory controller includes an encoding unit that executes an error correction coding process on input-data and generates a code word, a calculation control unit that controls whether to execute a multiplication calculation of a multiplication circuit, and a memory interface unit that controls writing of the code word to the memory and reading of the code word from the memory, and the encoding unit includes a remainder circuit that performs a remainder calculation on the input-data using a first generator polynomial and generates a first code word having a first error correction capability and a first multiplication circuit that performs a multiplication calculation on the first code word using a second generator polynomial and performs a multiplication calculation of generating a second code word having a second error correction capability.

17 Claims, 3 Drawing Sheets

MEMORY CONTROLLER, STORAGE DEVICE AND MEMORY CONTROL METHOD

CROSS-REFERENCE TO RELATED APPLICATIONS

This application is based upon and claims the benefit of priority from Provisional Patent Application No. 61/770,092, filed on Feb. 27, 2013; the entire contents of which are incorporated herein by reference.

FIELD

Embodiments described herein relate generally to a memory controller, a storage device, and a memory control method.

BACKGROUND

As an error correction code, there are a systematic code and a non-systematic code. The systematic code is a code in which encoded data (code word) is separated into encoding target data (message) and redundant data (parity) that is newly added by encoding. The non-systematic code is a code in which a code word is not separated into a message and a parity.

In the case in which the systematic code is used, in order to extract a message, an operation of removing an error from a code word is performed, and then a message part included in the code word only has to be extracted. On the other hand, in the case in which the non-systematic code is used, an operation of removing an error from a code word is performed, and then an operation of extracting a message from the corrected code word needs to be performed.

Meanwhile, when a single circuit is desired to have a plurality of correction capabilities, in the case in which the non-systematic code is used, a multiplication circuit (a circuit to multiply input polynomial and generator polynomial) is used for encoding. Therefore, in order to change a correction capability, multiplication circuits of a generator polynomial corresponding to the correction capabilities desired to be added only have to be connected in series. Thus, when the non-systematic code is used, a plurality of correction capabilities can be implemented with the circuit size of a multiplication circuit corresponding to a maximum correction capability among a plurality of correction capabilities. On the other hand, when the systematic code is used, since a modulo circuit or a remainder circuit (a circuit to calculate the remainder of division of input polynomial by generator polynomial) is used for encoding, the circuit size increases in approximate proportion to the number of correction capabilities.

DETAILED DESCRIPTION

In general, according to one embodiment, a memory controller includes an encoding unit that executes an error correction coding process on input-data and generates a code word, a calculation control unit that controls whether to executes a multiplication calculation of a multiplication circuit, and a memory interface unit that controls writing of the code word to the memory and reading of the code word from the memory, and the encoding unit includes a remainder circuit that performs a remainder calculation on the input-data using a first generator polynomial and generates a first code word having a first error correction capability and a first multiplication circuit that performs a multiplication calculation on the first code word using a second generator polynomial and performs a multiplication calculation of generating a second code word having a second error correction capability.

Exemplary embodiments of a memory controller, a semiconductor storage device, and a memory control method will be explained below in detail with reference to the accompanying drawings. The present invention is not limited to the following embodiments.

Figure 1:
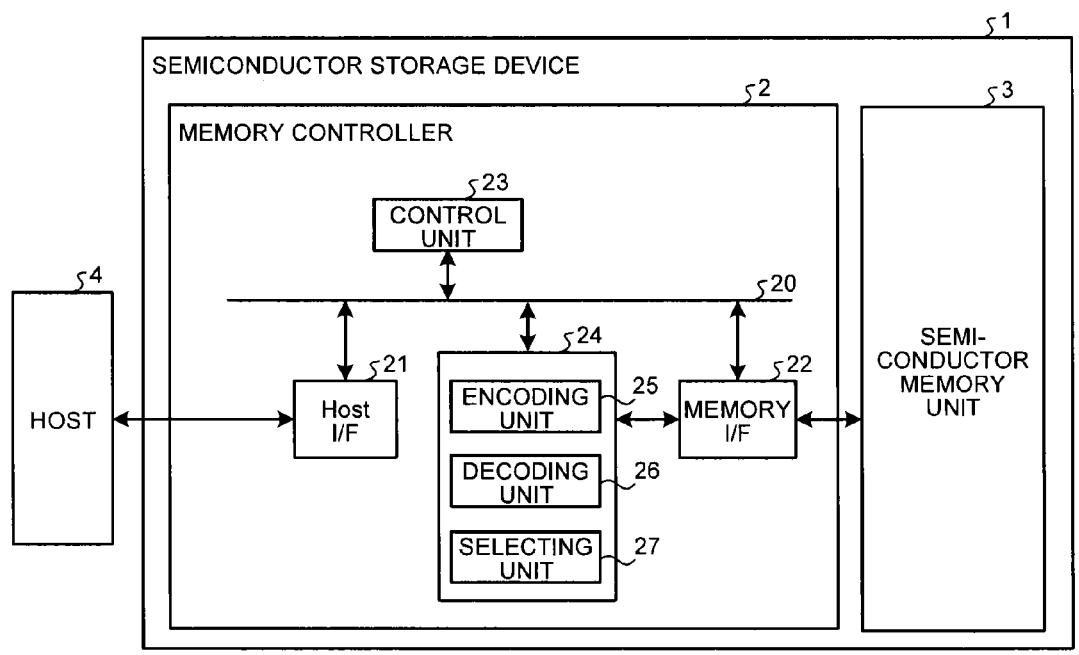
FIG. 1 is a diagram illustrating a configuration example of a semiconductor storage device according to an embodiment.

FIG. 1 is a diagram illustrating a configuration example of a semiconductor storage device (storage device) according to the present embodiment. A semiconductor storage device 1 according to the present embodiment includes a memory controller 2 and a semiconductor memory unit (memory) 3. The semiconductor storage device 1 is connectable with a host 4, and FIG. 1 illustrates a state in which the semiconductor storage device 1 is connected with the host 4. For example, the host 4 is an electronic device such as a personal computer or a portable terminal.

The semiconductor memory unit 3 is a non-volatile memory that stores data in a non-volatile manner such as a NAND memory. An example in which a NAND memory is used as the semiconductor memory unit 3 will be described, but a storage device other than a NAND memory may be used as the semiconductor memory unit 3, and a memory other than a semiconductor memory may be used instead of the semiconductor memory unit 3. In a NAND memory, generally, there is a writing unit (minimum writing) called a page, and writing is performed in units of pages.

The memory controller 2 controls writing to the semiconductor memory unit 3 according to a writing command (request) from the host 4, and controls reading from the semiconductor memory unit 3 according to a reading command (request) from the host 4. The memory controller 2 includes a Host I/F 21, a memory I/F 22, a control unit 23, and an encoding/decoding unit 24. The encoding/decoding unit 24 includes an encoding unit 25, a decoding unit 26, and a selecting unit (calculation control unit) 27. The Host I/F 21, the memory I/F 22, the control unit 23, the encoding unit 25, and the decoding unit 26 are connected with one another through an internal bus 20.

The Host I/F 21 executes processing according to an interface standard with the host 4, and outputs a command received from the host 4, user data, or the like to the internal bus 20. Further, the Host I/F 21 transmits user data read out of the semiconductor memory unit 3, a response from the control unit 23, or the like to the host 4.

The memory I/F 22 controls a writing process of writing data in the semiconductor memory unit 3 and a reading process of reading data from the semiconductor memory unit 3 based on an instruction from the control unit 23.

The control unit 23 is a controller that controls the components of the semiconductor storage device 1 in general. Upon receiving a command through the Host I/F 21 from the host 4, the control unit 23 performs control according to the command. For example, the control unit 23 instructs the memory I/F 22 to write a code word (user data and parity) in the semiconductor memory unit 3 and to read a code word from the semiconductor memory unit 3 according to a command from the host 4.

The encoding unit 25 executes an error correction coding process based on user data transferred to the internal bus 20. Any linear codes which can be transformed into the systematic form are available for the encoding unit 25, but BCH codes and RS codes are suitable to the present invention. The encoding unit 25 according to the present embodiment can support a plurality of error correction capabilities, and executes an error correction coding process corresponding to an error correction capability instructed from the selecting unit 27. The error correction capability represents the maximum number of erroneous bits which can be corrected by the decoding. For example, a first code word having a first error correction capability (a first error-correctable bit number) means an error-correctable code word when the number of error bits included in a code word is the first error-correctable bit number or less.

The decoding unit 26 executes a decoding process based on a code word (user data and parity) read out of the semiconductor memory unit 3. When the user data has no error, the user data read out of the semiconductor memory unit 3 is output to the internal bus 20 as is, whereas the user data has an error, error correction is performed using parity, and then the user data is output to the internal bus 20. The decoding unit 26 according to the present embodiment is adapted for a plurality of error correction capabilities, and executes a decoding process corresponding to an error correction capability instructed from the selecting unit 27.

The selecting unit 27 selects an error correction capability of an error correction coding process, and informs the encoding unit 25 and the decoding unit 26 of the selection result. A method of setting an error correction capability selected by the selecting unit 27 is not limited to a specific method. For example, the setting may be made according to an instruction from the control unit 23 or the like in the semiconductor storage device 1, the setting may be made according to a command from the host 4, or the setting may be made by a switching or the like disposed in the memory controller 2.

When there are memories having an error occurrence rate with which the present embodiment can afford to deal, the memory controller 2 can be still used even if the semiconductor memory unit 3 is replaced with one of these memories. Further, when there are regions having different error occurrence rates in the semiconductor memory unit 3, different error correction capabilities can be applied to the regions having different error occurrence rates.

Figure 2:
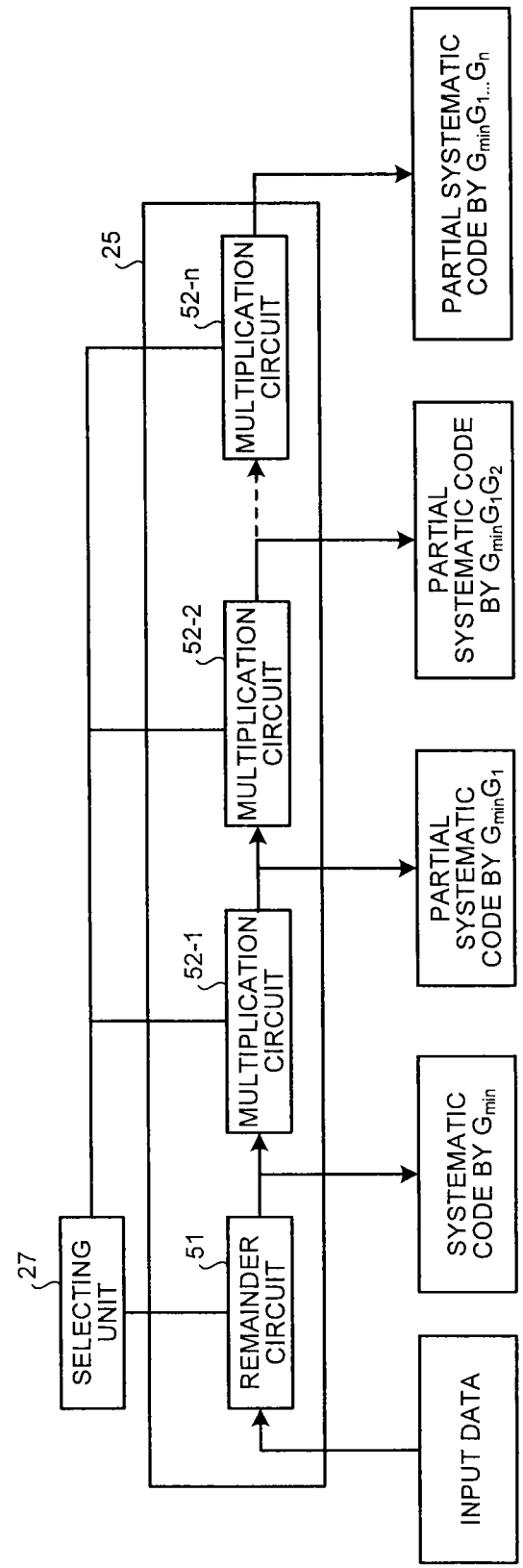
FIG. 2 is a diagram illustrating a configuration example of an encoding unit.

FIG. 2 is a diagram illustrating a configuration example of the encoding unit 25 according to the present embodiment. The encoding unit 25 according to the present embodiment includes a remainder circuit 51 and multiplication circuits 52-1 to 52-$n$ ($n$ is an integer of 1 or more). Among a plurality of error correction capabilities, a minimum error correction capability is hereinafter referred to as a minimum correction capability $t_{min}$. The number n of the multiplication circuits 52-1 to 52-$n$ depends on the number of supportable error correction capabilities.

The remainder circuit 51 generates a systematic code by executing a remainder calculation on input-data (user data) using a generator polynomial $G_{min}$ corresponding to the minimum correction capability. A multiplication circuit 52-$k$ ($k=1, 2, \ldots, n$) generates a non-systematic code by multiplication of input data polynomial by a generator polynomial $G_k$. For example, when n is 1, and the encoding unit 25 includes a remainder circuit that performs a remainder calculation on input-data (user data) using $G_{min}$ (a first generator polynomial) and generates a first code word having a first error correction capability, and a multiplication circuit 52-1 (a first multiplication circuit) that performs a multiplication calculation on the first code word using $G_1$ (a second generator polynomial) and performs a multiplication calculation capable of generating a second code word having a second error correction capability.

Figure 3:
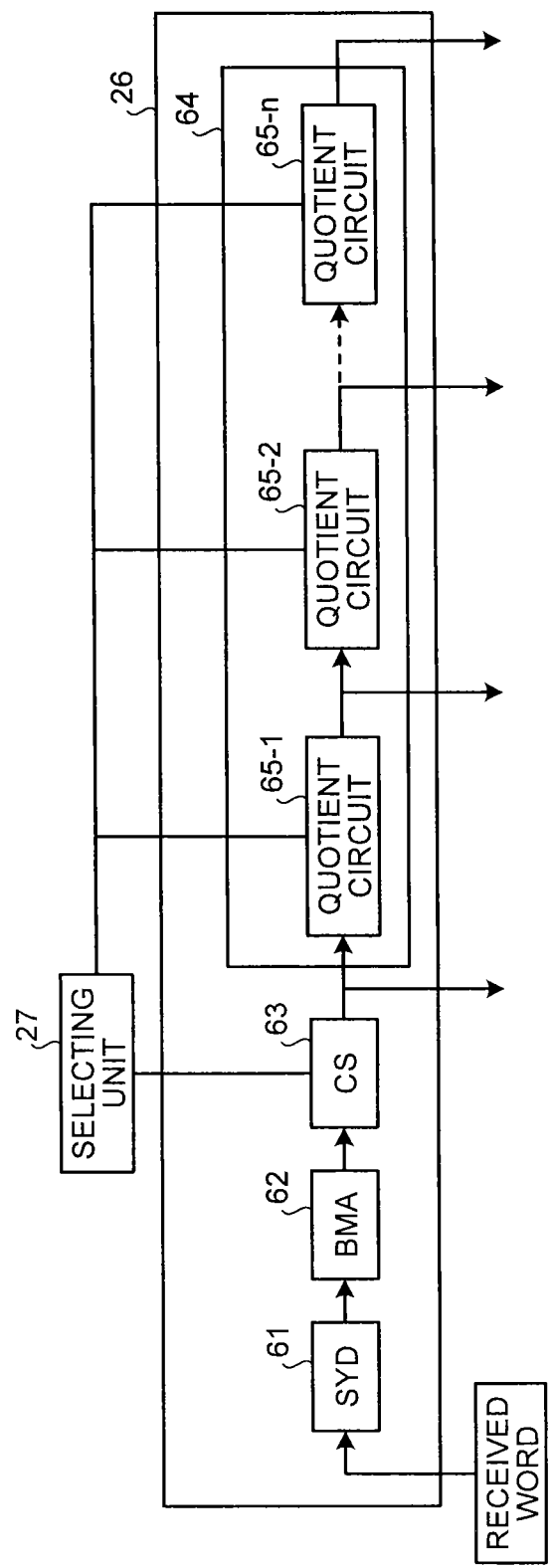
FIG. 3 is a diagram illustrating a configuration example of a decoding unit.

FIG. 3 is a diagram illustrating a configuration example of the decoding unit 26 according to the present embodiment. The decoding unit 26 according to the present embodiment includes a syndrome calculating unit (SYD) 61, an error locator polynomial calculating unit (BMA) 62, a Chien search unit (CS) 63, and a message decoding unit 64. The message decoding unit 64 includes quotient circuits (circuits to calculate the quotient of division of input polynomial by generator polynomial) 65-1 to 65-$n$.

The systematic code and the non-systematic code will be described. The systematic code is a code in which encoded data (code word) is separated into encoding target input-data (message) and redundant data (parity) that is newly added by encoding. The systematic code is generated by a remainder calculation using a generator polynomial. The systematic code is separated into a message part and its parity part, and thus a process of restoring the message at the time of decoding is unnecessary.

The non-systematic code is a code in which a code word is not separated into a message part and its parity part. The non-systematic code is generated by the multiplication of an input polynomial and a generator polynomial. For this reason, at the time of decoding, after a process of correcting an error from a code word is performed, a process of extracting a message from the corrected code word needs to be performed.

In order to describe the difference between the systematic code and the non-systematic code, a series of processes in which a message is encoded, an error occurs to the code through a communication channel, and the message is extracted, will be described. An example in which a code length is 15 bits, and 2-bit correctable BCH code using $G(x)=x^8+x^7+x^6+x^4+1$ as a generator polynomial is used will be described as a concrete example.

The systematic code can be encoded by a circuit of obtaining a remainder by dividing input-data (an input polynomial) by a generator polynomial. Typically, in a code word of a systematic code, a message part is arranged in the first part, and a parity part is arranged in the latter part. A channel inserts an error into a code word, so the code word is turned into a received word. In order to restore an original code word from the received word, various algorithms such as the BM (Berlekamp-Massey) decoding method or the Euclidean decoding method may be used, and the code word can be restored even using any of them. Thereafter, in order to extract an original message (input-data), the first part of the code word only needs to be extracted.

The non-systematic code can be encoded by a circuit of obtaining the multiplication of input-data (an input polynomial) and a generator polynomial. A code length of a code word in the non-systematic code is 15 bits as in the systematic code, but it is impossible to distinguish a message part and a parity part in the non-systematic code. In order to restore an original code word from a received word including an error, the same algorithm as the one for a systematic code can be used. Thereafter, a message is extracted from the restored code word, and this process can be implemented by a circuit for obtaining a quotient by dividing a code polynomial by a generator polynomial.

The process of restoring an original code word from a received word for a systematic code is the same as the one for a non-systematic code. In addition, for the encoding process, the circuit size for a systematic code is approximately same as the one for non-systematic code, because the remainder circuit is similar to multiplication circuit. Hence, in the perspective of circuit size, the quotient circuit is the only difference between systematic codes and non-systematic codes.

Next, three representative encoding methods compared to the present embodiment are considered. A first method is a method of independently preparing as many systematic code encoders as the number of necessary correction capabilities, a second method is to generalize a systematic encoder for a plurality of error correction capabilities, and a third method is a method of using a non-systematic code.

In the first method, since the number of independent systematic encoders is the same as the number of necessary correction capabilities, the circuit size increases in proportion to the number (types) of correction capabilities desired to be implemented. Thus, when variation of desired correction capabilities is small, for example the case that 50-bit and 100-bit corrections are required, an increase attributed to the variation is reasonable. But when the variation is large, an increase attributed to the variation is enormous.

The second method is the method of reusing a single systematic code encoder. In this method, the circuit size becomes about three times as large as a circuit for implementing a systematic code of a maximum correction capability. A generator polynomial for the minimum correction capability $t_{min}$ among a plurality of error correction capabilities is assumed to be $G_{min}$, a generator polynomial for an error correction capability $t_{min}+\Delta t_1$ is assumed to be $G_{min}G_1$, and a generator polynomial for a correction capability $t_{min}+\Delta t_2$ is assumed to be $G_{min}G_1G_2$. For the sake of simplification, an increase width $(\Delta t_2 - \Delta t_1)$ of a correction capability is assumed to be a constant amount of $\Delta t$. When variable correction capabilities from the minimum correction capability $t_{min}$ to the maximum correction capability $t_{max}$ at the correction capability width $\Delta t$ are considered, a set of necessary generator polynomials is $G_{min}, G_{min}G_1, G_{min}G_1G_2, \ldots, G_{min}G_1G_2 \ldots G_n$. A suffix n of a last formula is $n=\mathrm{ceil}((t_{max}-t_{min})/\Delta t)$ when a ceiling function $\mathrm{ceil}(x)$ is used.

For example, let us assume that $t_{min}$ is 4, $\Delta t$ is 1, and $t_{max}$ is 6. When a primitive root of the Galois extension field is represented by $\alpha$ and a minimum polynomial which has a root $\alpha^i$ is represented by $M_i$, $G_{min}$ is $M_1M_3M_5M_7$, $G_1$ is $M_9$, and $G_2$ is $M_{11}$, and three generator polynomials of $G_{min}$, $G_{min}G_1$, and $G_{min}G_1G_2$ are necessary. An example in which $t_{min}$ is 4, $\Delta t$ is 1, and $t_{max}$ is 6 will be briefly described. In order to generalize the systematic code encoder having the maximum correction capability $t_{max}$, as many register as an order of a generator polynomial for the maximum correction capability are prepared. A parity part is stored in the register after the encoding process is finished. This is the same configuration as a typical remainder circuit. The position of a register to which feedback is given is decided according to whether a coefficient of a generator polynomial is 1. The configuration of nonzero coefficients in a generator polynomial changes when a correction capability changes. Since the rule of the configuration change is not simple, all feedbacks are prepared, and each of them has a switch to determine whether the feedback works according to a selected correction capability. Hence, a circuit for calculating the position of feedback to be used or a calculation result table is prepared. The size of this generalized encoder is about twice or three times larger than that of the systematic encoder which correction capability is $t_{max}$, because of the feedback switch mechanism described above. In the third method, a variable correction capability is implemented by a non-systematic code that is encoded by a multiplication circuit. Unlike the remainder circuit, in order to change a correction capability in the multiplication circuit, a multiplication circuit of a generator polynomial corresponding to a correction capability desired to be added only has to be connected in series. For example, when three error correction capabilities respectively corresponding to three generator polynomials of $G_{min}$, $G_{min}G_1$, and $G_{min}G_1G_2$ are implemented by the non-systematic code similarly to the above-described method, the multiplication circuit corresponds to $G_{min}$, the multiplication circuit corresponding to $G_1$, and the multiplication circuit corresponding to $G_2$ are connected in series. Then, a configuration is made such that input-data is input to the multiplication circuit corresponding to $G_{min}$, an output of the multiplication circuit corresponding to $G_{min}$ is input to the multiplication circuit corresponding to $G_1$, and an output of the multiplication circuit corresponding to $G_1$ is input to the multiplication circuit corresponding to $G_2$. As a result, the output of the multiplication circuit corresponding to $G_1$ is a non-systematic code having a correction capability of $t_{min}+\Delta t$, and the output of the multiplication circuit corresponding to $G_2$ is a non-systematic code having a correction capability of $t_{min}+2\Delta t$.

As described in the third method, when the non-systematic code is used, it is possible to suppress an increase in the circuit size when the encoder is adapted for a plurality of error correction capabilities. On the other hand, in the non-systematic code, after an original code word is restored from a received word, a process (message decoding) of extracting a message from the non-systematic code word is necessary, and thus the size of the decoding circuit increases.

These three methods does not relate to the minimum correction capability. Hence, in this embodiment, the first encoding up to a minimum correction capability is systematic, and the encodings from more than the minimum correction capability are non-systematic by which a change in a correction capability can be flexibly handled as illustrated in FIGS. 2 and 3. Hereinafter, a code obtained by further encoding a systematic code through multiplication circuits for non-systematic encodings is referred to as a partial systematic code. In the present embodiment, using a partial systematic code, it is possible to reduce an increase of circuit size in the case that the encoder must deal with a plurality of error correction capabilities.

An encoding process according to the present embodiment will be described with reference to FIG. 2. First of all, an example of performing a process corresponding to a maximum correction capability $t_{max}$ will be described. The remainder circuit 51 performs the remainder calculation on input-data (user data) using the generator polynomial $G_{min}$ for the minimum correction capability $t_{min}$, and inputs the calculation result (a code word generated by the remainder circuit 51) to the multiplication circuit 52-1. The multiplication circuit 52-1 obtains the multiplication of the input-data and the generator polynomial $G_1$ for $\Delta t_1$, and input the obtained result (a code word generated by the multiplication circuit 52-1) to the multiplication circuit 52-2. The multiplication circuit 52-2 obtains the multiplication of the input-data and the generator polynomial $G_2$ for $\Delta t_2 - \Delta t_1$, and inputs the obtained result (a code word generated by the multiplication circuit 52-2) to the multiplication circuit 52-3. As described above, the multiplication circuit 52-$k$ obtains the multiplication of input-data and the generator polynomial $G_k$ for $\Delta t_k - \Delta t_{k-1}$, and inputs the obtained result (a code word generated by the multiplication circuit 52-$(k-1)$) to the multiplication circuit 52-$(k+1)$. The multiplication circuit 52-$n$ outputs a result of obtaining the multiplication of input-data and the generator polynomial $G_n$ for $\Delta t_n - \Delta t_{n-1}$ as a processing result of the encoding unit 25.

For the case of a correction capability other than the maximum correction capability $t_{max}$, an encoding process is performed in the same order as the one in the case of the maximum correction capability. However, if a selected correction capability is achieved by the encoding process from the remainder circuit 51 to the multiplication circuit 52-$t$ (0<$t$<n), the output of the encoding unit 25 is the output of multiplication circuit 52-$t$. The rest of the multiplication circuits need not operate.

For example, when an increase width of an error correction capability is set to a certain amount of $\Delta t$, $t_{min}$ is set to 4, $\Delta t$ is set to 1, and $t_{max}$ is set to 6, three types of error correction capabilities of 4 bits, 5 bits, 6 bits are available. In this case, when the selecting unit 27 notifies the encoding unit 25 of 4 bits as the selection result, the output of the remainder circuit 51, that is, the systematic code by $G_{min}$ is output as the processing result of the encoding unit 25. When the selecting unit 27 notifies the encoding unit 25 of 5 bits as the selection result, the output of the multiplication circuit 52-1, that is, the partial systematic code by $G_{min}G_1$ is output as the processing result of the encoding unit 25. When the selecting unit 27 notifies the encoding unit 25 of 6 bits as the selection result, the output of the multiplication circuit 52-2, that is, the partial systematic code by $G_{min}G_1G_2$ is output as the processing result of the encoding unit 25.

Here, the selecting unit 27 selects an output of the encoding unit 25 among code words output from the remainder circuit 51 and the multiplication circuits 52-1 to 52-$n$. The selecting unit 27 controls whether to perform a calculation in each of the multiplication circuits 52-1 to 52-$n$.

A generator polynomial $G_{min}$ has consecutive roots. Let $G_1$ be a generator polynomial which has further consecutive roots from the roots of $G_{min}$. Similarly, let $G_{k+1}$ be a generator polynomial which has further consecutive roots from the roots of $G_k$. For example, $t_{min}$ is set to 4, $\Delta t$ is set to 1, and $t_{max}$ is set to 6, and $G_{min}$ is set to $M_1M_3M_5M_7$, $G_1$ is set to $M_9$, and $G_2$ is set to $M_{11}$ so that the generator polynomial of the maximum correction capability includes consecutive roots $\alpha^1, \alpha^2, \alpha^3, \alpha^4, \alpha^5, \alpha^6, \alpha^7, \alpha^8, \alpha^9, \alpha^{10}, \alpha^{11}$, and $\alpha^{12}$.

FIG. 2 illustrates the configuration in which an instruction is input from the selecting unit 27 to each circuit, and each circuit operates according to the instruction. The present embodiment is not limited to the configuration example of FIG. 2 as long as the processing result of the encoding unit 25 is any one of the outputs of the remainder circuit 51 and the multiplication circuits 52-1 to 52-$n$ in response to the instruction from the selecting unit 27. For example, the outputs of the remainder circuit 51 and the multiplication circuits 52-1 to 52-$n$ may be input to the demultiplexer, and the demultiplexer may output the processing result of the encoding unit 25 based on the instruction from the selecting unit 27.

Next, a decoding process according to the present embodiment will be described with reference to FIG. 3. A received word (a code word read out of the semiconductor memory unit 3 in the present embodiment) to be input to the decoding unit 26 is input to the syndrome calculating unit 61. The syndrome calculating unit 61 calculates a syndrome from the received word, and inputs the calculated syndrome to the error locator polynomial calculating unit 62. The error locator polynomial calculating unit 62 executes an error locator polynomial calculation based on the syndrome. The Chien search unit 63 executes the Chien search using the error locator polynomial calculation result, and specifies an error position. Further, the Chien search unit 63 also executes an error correction operation which inverts erroneous bits detected by the search. The error correction operation may be executed by the control unit 23 rather than the Chien search unit 63. Further, instead of the selecting unit 27, a decoding control unit may be provided, and the decoding control unit may have the function of the selecting unit 27 and execute the error correction operation.

The syndrome calculating unit 61, the error locator polynomial calculating unit 62, and the Chien search unit 63 described above configure an error correction processing unit that specifies the error position and corrects the error. Processing of the error correction processing unit is the same as when a typical systematic code or a typical non-systematic code is used.

The error-corrected received word is input to the message decoding unit 64. The message decoding unit 64 executes a message decoding process according to a correction capability selected by the selecting unit 27. The selecting unit 27 selects the same error correction capability as the one used when the received word was encoded. First of all, the message decoding process will be described in connection with an example in which processing corresponding to the maximum correction capability $t_{max}$ is performed. The quotient circuit 65-1 obtains a quotient by dividing input-data by $G_1$, and inputs the obtained quotient (interim data calculated by the quotient circuit 65-1) to the quotient circuit 65-2. The quotient circuit 65-2 obtains a quotient by dividing input-data by $G_2$, and inputs the obtained quotient (interim data calculated by the quotient circuit 65-2) to the quotient circuit 65-2. As described above, the quotient circuit 65-$k$ obtains a quotient by dividing input-data by $G_k$, and inputs the obtained quotient (interim data calculated by the quotient circuit 65-$k$) to the quotient circuit 65-($k$+1). The quotient circuit 65-$n$ obtains a quotient by dividing input-data by $G_n$, and outputs the obtained quotient as the decoding result of the decoding unit 26.

When processing is performed with the minimum correction capability $t_{min}$, since it is unnecessary to perform the message decoding, the error-corrected received word is output as the decoding result as is. When processing is performed with a correction capability other than the minimum correction capability $t_{min}$ or with a correction capability other than the maximum correction capability $t_{max}$, processing is performed in the order of the quotient circuit 65-1, the quotient circuit 65-2, and the like, similarly to the case of the maximum correction capability $t_{max}$. However, in this case, if a selected correction capability is achieved in the encoding process with the remainder circuit 51 and from the multiplication 52-1 to the multiplication circuit 52-$t$ (0<$t$<n), the output of the decoding unit 26 is the output of the quotient circuit 65-$t$. The rest of the quotient circuits need not operate.

In the present embodiment, since the systematic encoder is used if the correction capability is $t_{min}$, it is unnecessary to provide a quotient circuit corresponding to $G_{min}$. Thus, compared to the example using only the non-systematic code, the circuit size of the message decoding unit can be reduced.

The decoding unit 26 is configured such that an instruction is input from the selecting unit 27 to each circuit, and each circuit outputs the processing result of the encoding unit 25 based on the selection result, but the present invention is not limited to this configuration example, similarly to the encoding unit 25.

The above description has been made in connection with the example in which $\Delta t$ is 1 as a concrete example, but $\Delta t$ is not limited to 1 and may be 2 or more. Further, an increase width of the error correction capability may not be constant, and $\Delta t_1$ and $\Delta t_2 - \Delta t_1$ may be different values.

As described above, the advantage of both systematic and non-systematic code is included in this partial systematic code. Hence, an increase of circuit size attributed to adaptation for a plurality of error correction capabilities is suppressed. Further, compared to the example in which the non-systematic code is used, processing of the message decoding unit 64 can be simplified, and thus a message decoding processing time can be reduced.

For example, under the assumption that a correction capability varies between 100 bits and 120 bits (here, $\Delta t=1$), the circuit size is compared. In the following, the unit of the circuit size is that of a systematic encoder circuit for a fixed correction capability of 120 bits. In this case, when generalized systematic encoder is used, the circuit size increases about three times, and when the non-systematic code is used, the circuit size increases about twice. On the other hand, in the present embodiment, the circuit size increases about 1.1 to 1.2 times.

The present embodiment has been described in connection with the example in which the encoding/decoding unit 24 is used for a semiconductor storage device, but the encoding/decoding unit 24 according to the present embodiment is not limited to a semiconductor storage device and can be applied to the other purposes such as a communication device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller controlling a memory, comprising:
an encoding unit that executes an error correction coding process on input-data to generate a code word; the encoding unit including a remainder circuit that calculates a remainder obtained by dividing the input-data by a first generator polynomial and generates a first code word having a first error correction capability, and a first multiplication circuit that multiplies the first code word by a second generator polynomial and generates a second code word having a second error correction capability, the first code word being a code word of systematic code, the second code word being a code word of non-systematic code;
a calculation control unit that controls whether to execute the multiplication calculation of the multiplication circuit; and
a memory interface unit that controls writing of the code word to the memory and reading of the code word from the memory.

2. The memory controller according to claim 1,
wherein the encoding unit further includes a second multiplication circuit, the second multiplication circuit performs a multiplication calculation on the second code word using a third generator polynomial and generates a third code word having a third error correction capability, and the code word further includes the third code word.

3. The memory controller according to claim 1, further comprising,
a decoding unit that executes a decoding process on the code word,
the decoding unit including
an error correction processing unit that performs an error correction process on the code word, and
a quotient circuit that calculates a quotient by dividing the second code word that has been subjected to the error correction process by the second generator polynomial.

4. The memory controller according to claim 2, further comprising
a decoding unit that executes a decoding process on the code word,
the decoding unit including
an error correction processing unit that performs an error correction process on the code word,
a first quotient circuit that calculates a quotient by dividing the third code word that has been subjected to the error correction process by the second generator polynomial and obtains interim data, and
a second quotient circuit that calculates a quotient by dividing the interim data by the third generator polynomial.

5. The memory controller according to claim 2,
wherein a difference between the second error correction capability and the first error correction capability is not equal to a difference between the third error correction capability and the second error correction capability.

6. The memory controller according to claim 1,
wherein the second generator polynomial has a root consecutive to a root of the first generator polynomial.

7. The memory controller according to claim 2,
wherein the second generator polynomial has a root consecutive to a root of the first generator polynomial, and the third generator polynomial has a root consecutive to a root of the second generator polynomial.

8. The memory controller according to claim 1,
wherein the calculation control unit does not execute a calculation of the multiplication circuit when causing the encoding unit to generate the first code word having the first error correction capability, and executes a calculation of the multiplication circuit when causing the encoding unit to generate the second code word having the second error correction capability.

9. A storage device, comprising:
a memory;
an encoding unit that executes an error correction coding process on input-data to generate a code word; the encoding unit including a remainder circuit that calculates a remainder obtained by dividing the input-data by a first generator polynomial and generates a first code word having a first error correction capability, and a first multiplication circuit that multiplies the first code word by a second generator polynomial and generates a second code word having a second error correction capability, the first code word being a code word of systematic code, the second code word being a code word of non-systematic code;
a calculation control unit that controls whether to executes the multiplication calculation of the multiplication circuit; and
a memory interface unit that controls writing of the code word to a memory and reading of the code word from the memory.

10. The storage device according to claim 9,
wherein the encoding unit further includes a second multiplication circuit, the second multiplication circuit performs a multiplication calculation on the second code word using a third generator polynomial and generates a third code word having a third error correction capability, and the code word further includes the third code word.

11. The storage device according to claim 9, further comprising,
a decoding unit that executes a decoding process on the code word,
the decoding unit including
an error correction processing unit that performs an error correction process on the code word, and
a quotient circuit that calculates a quotient by dividing the second code word that has been subjected to the error correction process by the second generator polynomial.

12. The storage device according to claim 10, further comprising,
a decoding unit that executes a decoding process on the code word,
the decoding unit including
an error correction processing unit that performs an error correction process on the code word,
a first quotient circuit that calculates a quotient by dividing the third code word that has been subjected to the error correction process by the second generator polynomial and obtains interim data, and
a second quotient circuit that calculates a quotient by dividing the interim data by the third generator polynomial.

13. The storage device according to claim 10,
wherein a difference between the second error correction capability and the first error correction capability is not equal to a difference between the third error correction capability and the second error correction capability.

14. The storage device according to claim 9,
wherein the second generator polynomial has a root consecutive to a root of the first generator polynomial.

15. The storage device according to claim 10,
wherein the second generator polynomial has a root consecutive to a root of the first generator polynomial, and the third generator polynomial has a root consecutive to a root of the second generator polynomial.

16. The storage device according to claim 9,
wherein the calculation control unit does not execute a calculation of the multiplication circuit when causing the encoding unit to generate the first code word having the first error correction capability, and executes a calculation of the multiplication circuit when causing the encoding unit to generate the second code word having the second error correction capability.

17. A memory control method controlling a memory, comprising:
selecting one of a first error correction capability and a second error correction capability;
calculating a remainder obtained by dividing the input-data by a first generator polynomial to generate a first code word having a first error correction capability, the first code word being a code word of systematic code;
when the first error correction capability is selected, storing the first code word in the memory; and
when the second error correction capability is selected, multiplying the first code word by a second generator polynomial, generating a second code word having the second error correction capability, and storing the second code word in the memory, the second code word being a code word of non-systematic code.

* * * * *